(12) United States Patent
Rogers

(10) Patent No.: US 6,816,486 B1
(45) Date of Patent: Nov. 9, 2004

(54) CROSS-MIDPLANE SWITCH TOPOLOGY

(75) Inventor: William Paul Rogers, Collingswood, NJ (US)

(73) Assignee: Inrange Technologies Corporation, Lumberton, NJ (US)

( * ) Notice: Subject to any disclaimer, the term of this patent is extended or adjusted under 35 U.S.C. 154(b) by 495 days.

(21) Appl. No.: 09/483,018

(22) Filed: Jan. 13, 2000

Related U.S. Application Data

(60) Provisional application No. 60/126,142, filed on Mar. 25, 1999.

(51) Int. Cl.⁷ .............................................. H04L 12/52
(52) U.S. Cl. ...................................... 370/387; 340/2.21
(58) Field of Search ................................ 370/387, 388, 370/386, 380, 359; 340/826, 827, 825.8; 361/778, 781, 788, 790, 791, 805, 826, 828; 379/271; 700/245

(56) References Cited

U.S. PATENT DOCUMENTS

| | | | | |
|---|---|---|---|---|
| 4,393,381 A | | 7/1983 | Seiden | |
| 4,472,765 A | * | 9/1984 | Hughes | 361/791 |
| 4,703,394 A | * | 10/1987 | Petit | 361/790 |
| 4,876,630 A | * | 10/1989 | Dara | 361/791 |
| 4,878,215 A | | 10/1989 | Rogers | |
| 5,640,387 A | * | 6/1997 | Takahashi | 370/359 |
| 5,675,580 A | * | 10/1997 | Lyon | 370/250 |
| 5,870,528 A | * | 2/1999 | Fukuda | 700/245 |

OTHER PUBLICATIONS

Charles Clos, "A Study of Non-Blocking Switching Networks", *The Bell System Technical Journal* Mar., 1953, pp. 406–424.

\* cited by examiner

*Primary Examiner*—Edwin C. Holloway, III
(74) *Attorney, Agent, or Firm*—Beck & Tysuer PLLC

(57) ABSTRACT

A chassis for holding modules including a set of first modules oriented horizontally in the chassis and a set of second modules oriented vertically in the chassis. A midplane is oriented orthogonally to the sets of first and second modules. The midplane has connector pins extending from its first side through its second side. Each of the first modules has a first connector for mating with the connector pins extending from the first side, and each of the second modules has a second connector for mating with the connector pins extending from the second side.

22 Claims, 8 Drawing Sheets

CROSS-MIDPLANE SWITCH TOPOLOGY

RELATED APPLICATIONS

This application claims priority of U.S. Provisional Application Ser. No. 60/126,142, inventor William P. Rogers entitled CROSS MIDPLANE HIGH SPEED MATRIX SWITCH, filed on Mar. 25, 1999.

TECHNICAL FIELD

The present invention relates, in general, to interconnection topologies between circuit boards in a chassis, and more specifically, to an interconnection topology for large arrays of switching modules requiring high speed.

BACKGROUND OF THE INVENTION

Three stage switches are known in the art. As the name implies, three stage switches typically have three stages, namely, an input stage, a middle stage and an output stage.

The interconnection topology for arrays, of this type includes is one signal path from each of a number of input subswitches connected to each of a number of middle subswitches which in turn have one path connecting them to a number of output subswitches. An example of this is the INRANGE Technologies Corp. 2700 matrix switch. The 2700 switch includes 128 input subswitches with 32 input ports per subswitch. The 2700 switch provides one signal path from each of these input subswitches to 64 middle subswitches. One output from each of these middle subswitches may be connected to each of 128 output subswitches. Each output subswitch includes 32 outputs.

Referring to FIG. 1, there is shown a conventional three stage matrix switch, generally designated as 10. The input stage includes 128 input subswitches, designated as 12a–12n. Each input subswitch includes a 32×64 input submatrix having 32 input receivers and 64 single ended output drivers. Although not shown, each input receiver may be connected to each of the 64 output drivers.

As an example of input receivers connected to output drivers, an 8×16 submatrix switch 100 is shown in FIG. 8. As shown, switch 100 includes 8 input receivers 102 (on the horizontal lines) and 16 output drivers 104 (on the vertical lines). At the intersection of each horizontal and vertical line, a crosspoint switch is shown as indicated by a diagonal line. If the switch at any intersection (crosspoint) is off, that input is not connected to that output. If the switch is on, that input is connected to that output. In the example shown in FIG. 8, In-5 is connected to Out-9 by crosspoint switch 106 being on. In this manner, it is possible for any input to be connected to any output or for any input to be connected to multiple outputs.

Referring again to FIG. 1, the middle stage includes 64 middle subswitches, designated as 14a–14m. Each middle subswitch includes a 128×128 middle submatrix having 128 input receivers and 128 output drivers. Although not shown, each input receiver of middle submatrix 14a may be connected to each of the 128 output drivers.

Still referring to FIG. 1, the output stage includes 128 output subswitches, designated as 16a–16n. Each output subswitch includes a 64×32 output submatrix having 64 input receivers and 32 output drivers. Similar to the other stages, each input receiver of output submatrix 16a may be connected to each of the 32 output drivers.

Thus, matrix switch 10 includes 4096 (32×128=4096) line receivers, which are respectively connected to 4096 external input ports, designated as 18. Matrix switch 10 also includes 4096 line drivers at the output stage, which are respectively connected to 4096 external output ports, designated as 20. Connections between the output drivers of the first stage 12a–12n and the input receivers of the middle stage 14a–14m are made by way of a plurality of wires 22, which reside in backplanes of the chassis (not shown). Similarly, connections between the output drivers of the middle stage and the input receivers of the third stage 16a–16n are made by way of a plurality of wires 24, which also reside in the chassis backplanes (not shown).

Matrix switch 10 is physically arranged into a plurality of modules or circuit boards. Each module or circuit board includes an input cross-point array of one 32×64 input submatrix 12a and an output cross-point array of one 64×32 output submatrix 16a. These modules are hereinafter referred to as input/output modules. Another type of module or circuit board is included in matrix switch 10, hereinafter referred to as middle matrix modules. Each middle matrix module includes one 128×128 middle submatrix 14a. Thus, matrix switch 10, as shown in FIG. 1, includes 4096 input ports and 4096 output ports, 128 input/output modules and 64 middle matrix modules.

The modules of matrix switch 10 are arranged physically in eight chassis. One such chassis is shown in FIG. 2 and is generally designated as 30. As shown, 24 circuit boards are plugged into chassis 30. These boards include 16 input/output modules (designated as I/OM1–I/OM16) and 8 middle matrix modules (designated as MMM1–MMM8). The modules plug into the chassis from the front and are horizontally oriented, as shown. A sixteen layer backplane, designated as 32, is required to interconnect the modules in the chassis and to connect the modules to connectors 34 on the chassis. Connectors 34 provide connections to other chassis in matrix switch 10. For example, connectors 34 permit sending 3584 single-ended signals to other chassis in matrix switch 10.

Although matrix switches of the type shown in FIGS. 1 and 2 have been adequate, the ever increasing speed of communication in networks has resulted in exceeding the speed capabilities of many existing matrix switches. One obstacle to producing faster switches is the need for balanced signaling between modules. Because of the need for maintaining matched impedances and minimal signal length differentials within signal pairs, there is the need to double the number of signals interconnecting the modules. Doubling the number of signals on each backplane may necessitate increasing the number of backplane layers from 16 to 32. The number of signals interconnecting a chassis may also need to be doubled. Also, the distance a signal travels tends to lower the overall speed of the switch. As a result, a need still exists to develop a matrix switch that may be used in high speed applications requiring balanced differential signal pairs. A need also exists to develop a high speed matrix switch without increasing the number of backplane layers in the chassis.

SUMMARY OF THE INVENTION

To meet this and other needs, and in view of its purposes, the present invention provides a chassis for holding modules including a set of first modules oriented horizontally in the chassis and a set of second modules oriented vertically in the chassis. A midplane is oriented orthogonally to the sets of first and second modules. Connector pins extend from a first side of the midplane through to the second side of the midplane. Each of the first modules has a first connector for mating with the connector pins extending from the first side, and each of the second modules has a second connector for mating with the connector pins extending from the second side. Each of the first modules includes first and third stages of switching arrays and each of the second modules includes a second stage of switching arrays, wherein the first, second and third stages of switching arrays are sequentially connected in series. A signal is routed from the first stage into the second stage by way of at least one pin of the connector pins on the midplane, and then sequentially routed from the second stage to the third stage by way of at least another pin of the connector pins on the midplane. The first and second connectors are female connectors for respectively mating with the connector pins extending from the first and second sides of the midplane. The midplane includes power and ground signals.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures.

DETAILED DESCRIPTION OF THE INVENTION

Figure 1:
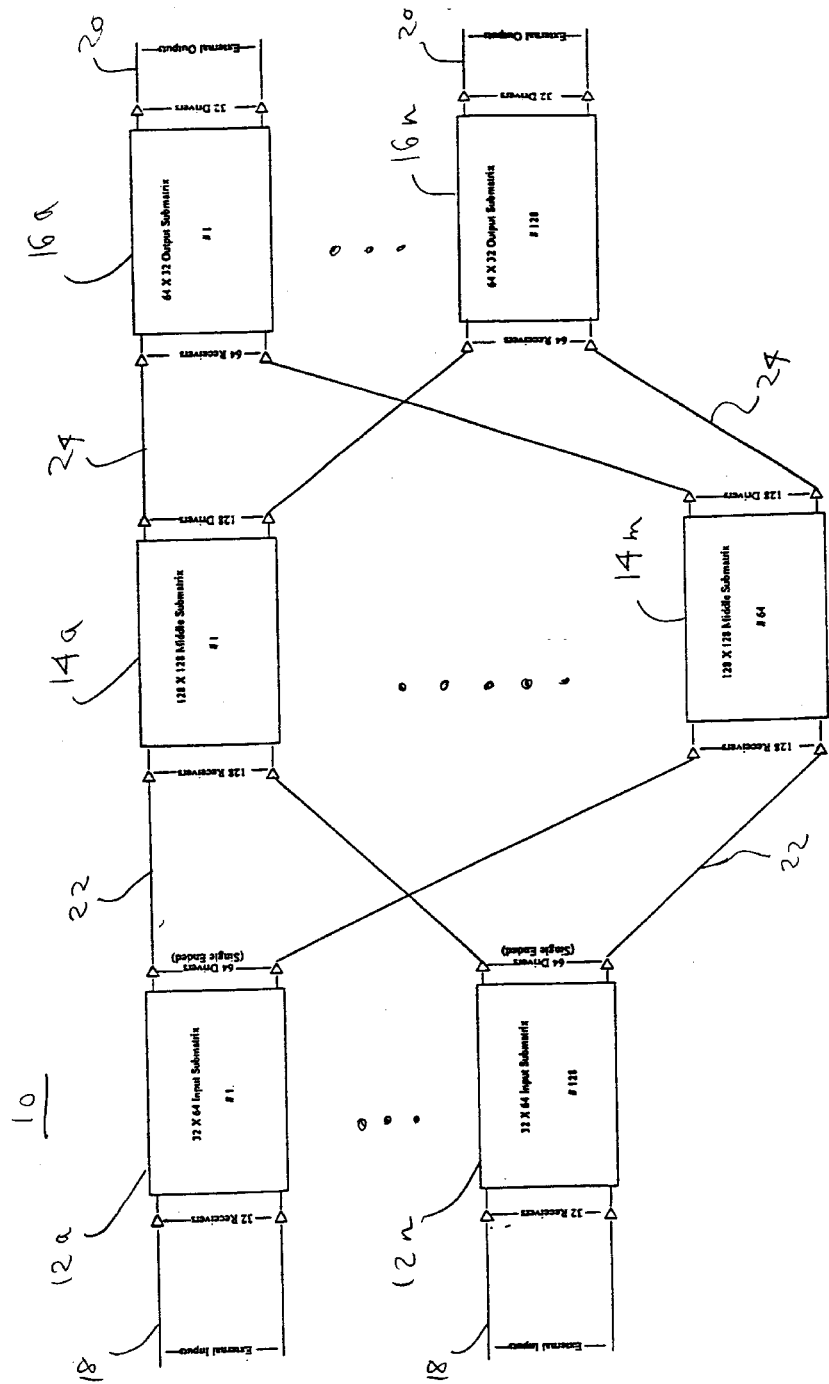
FIG. 1 is a schematic block diagram showing a conventional matrix switch with three stages of modules.
Figure 2:
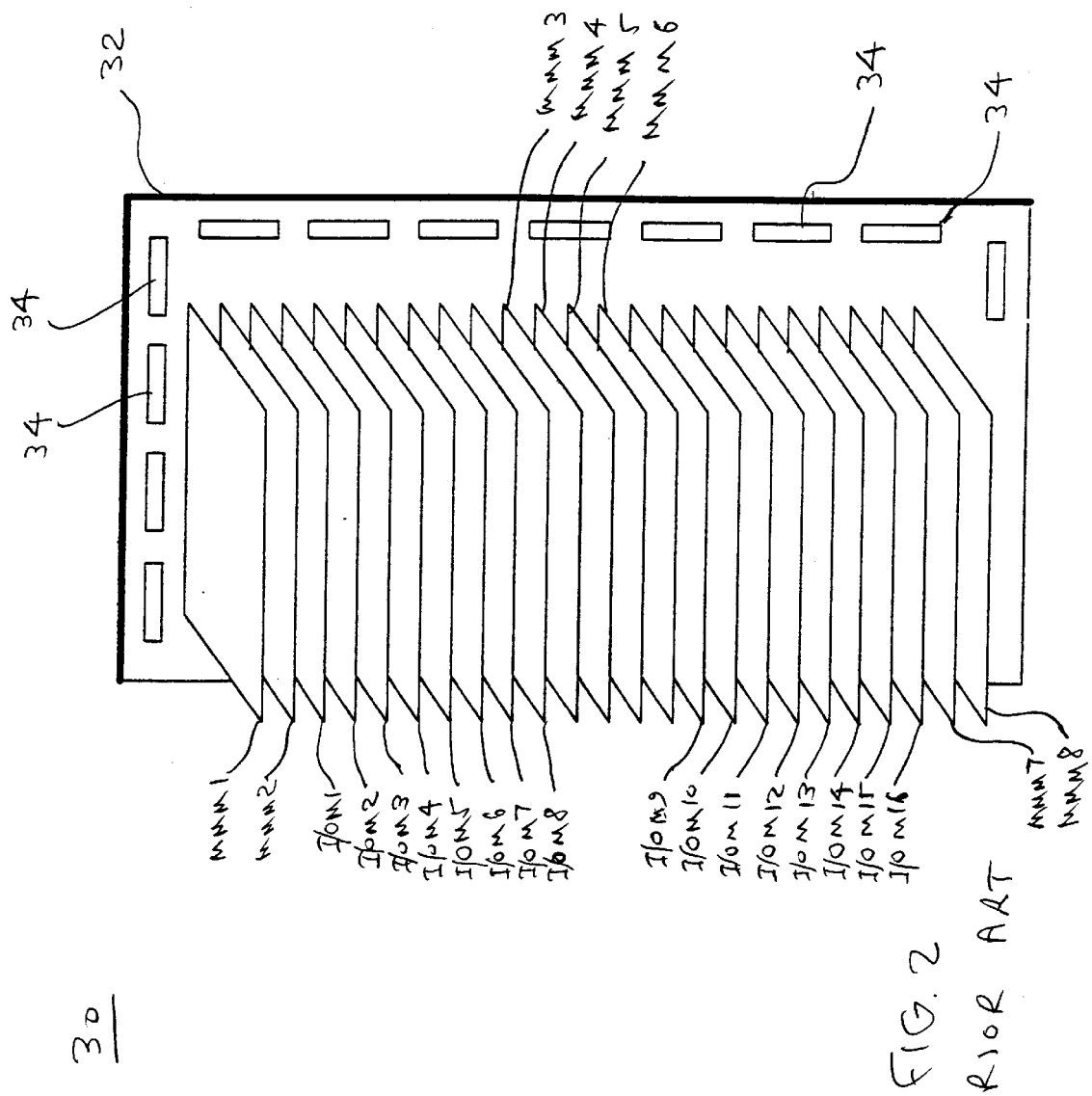
FIG. 2 is a perspective view of a conventional chassis topology incorporating the matrix switch of FIG. 1.
Figure 3:
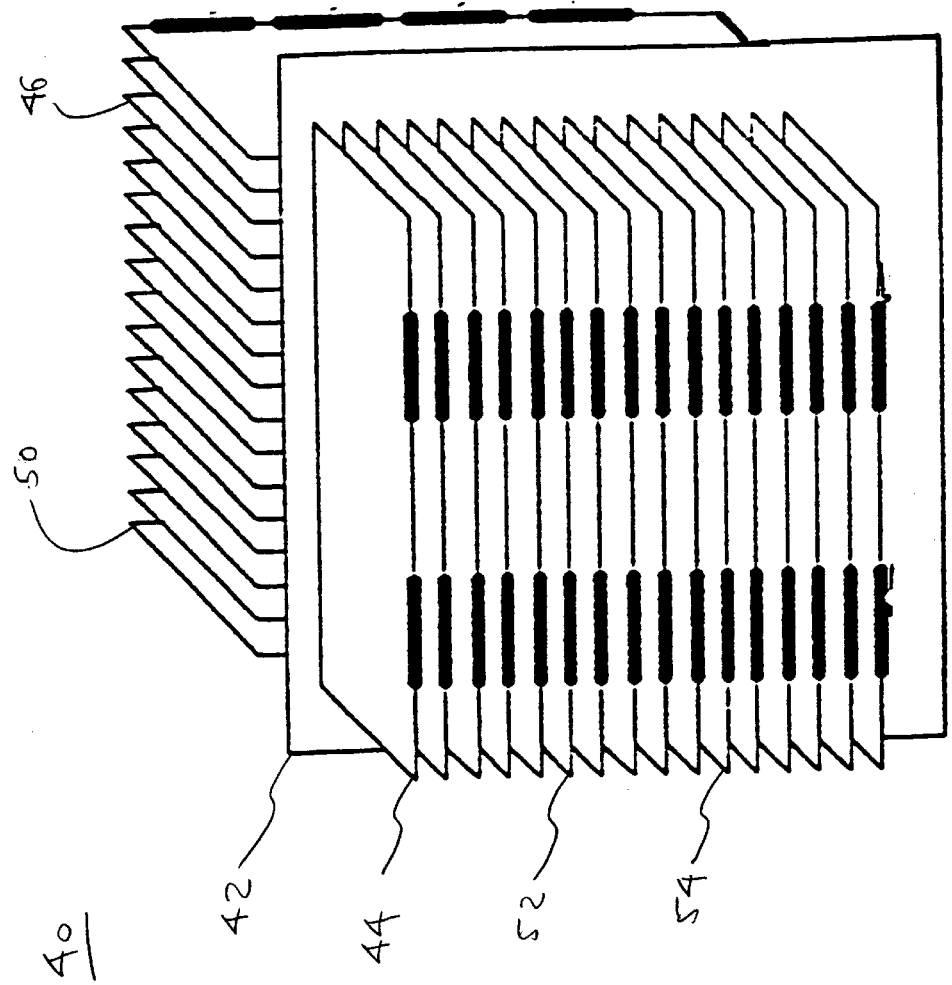
FIG. 3 is a perspective view of a cross-midplane switch topology, according to the invention, incorporating a matrix switch with three stages of modules.

Referring to FIG. 3, there is shown a cross-midplane switch topology in accordance with one embodiment of the present invention. Rather than mounting all the modules in the same orientation on the same side of a backplane, input/output modules may be mounted in a horizontal orientation on the front of a midplane and middle matrix modules may be mounted in a vertical orientation on the back of the same midplane. As shown, high speed matrix switch 40 includes midplane 42 within a chassis (not shown). Midplane 42 receives a plurality of input/output modules 44 and a plurality of middle matrix modules 46. The input/output modules are mounted horizontally on the midplane and on one side of the midplane (for example, the front). The middle matrix modules are mounted vertically on the midplane and on the other side of the midplane (for example, the rear). The resulting topology eliminates the backplane layers required in conventional topologies.

Although not shown, it will be appreciated that each module of the plurality of modules 44 and 46 includes input receivers, output drivers, power and ground busses, as well as control signals. Some modules may be operated at a relatively slow speed with the use of single-ended receivers and drivers, while other modules may be operated at a relatively high speed with the use of double-ended receivers and drivers. This may be achieved by using balanced differential signaling. While the use of differential signaling may double the number of signal paths needed for the switch fabric (wiring interconnecting the three switch stages), the midplane topology avoids the need for maintaining constant impedance through the switch fabric, reduces cross-talk, and attains minimal skew between differential pairs on the midplane (backplane).

It will be appreciated that double-ended drivers and receivers may also be referred to as differential drivers and receivers. Differential drivers and receivers are well suited for high speed signaling, because they use matched transmission traces or wires. Each differential driver or receiver senses differential voltage levels, instead of a voltage level referenced to ground potential. Also, the net current flow of differential signals relative to ground is zero. As a result, little or no ground current flows during switchings of large number of signals.

As will be explained, the midplane topology shown in FIG. 3 allows for the switch fabric to pass through the midplane, without the switch fabric having to span across the midplane. In other words, the backplane layers present in conventional matrix switches are eliminated in the embodiment of the present invention. This may be seen by referring to FIG. 4, which is a partial and exploded view of the matrix switch shown in FIG. 3. For explanation purposes, only one input/output module 44 and one middle matrix module 46 are shown on opposite sides of midplane 42. Input/output module 44 has a plurality of female connector blocks 44a and 44b. Similarly, middle matrix module 46 has a plurality of female connector blocks 46b and 46c. In order to receive the respective female connectors, midplane 42 has a plurality of male connectors 42a, 42b and 42c. Each male connector has a plurality of pins 48, whereby each pin 48 is orthogonal to the planar surfaces (front and rear) of midplane 42. The ends of each pin protrude an equal distance away from each planar surface of midplane 42. In this manner, a single pin 48 may engage a single receptacle of an input/output module and a single receptacle of a middle matrix module. For example, one end of pin 48 of male connector 42b may engage receptacle 50 of female connector block 44b, and the other end of pin 48 may engage receptacle 52 of female connector block 46b. Thus, pins 48 are the connecting fabric between the input/output modules and the middle matrix modules.

Figure 7:
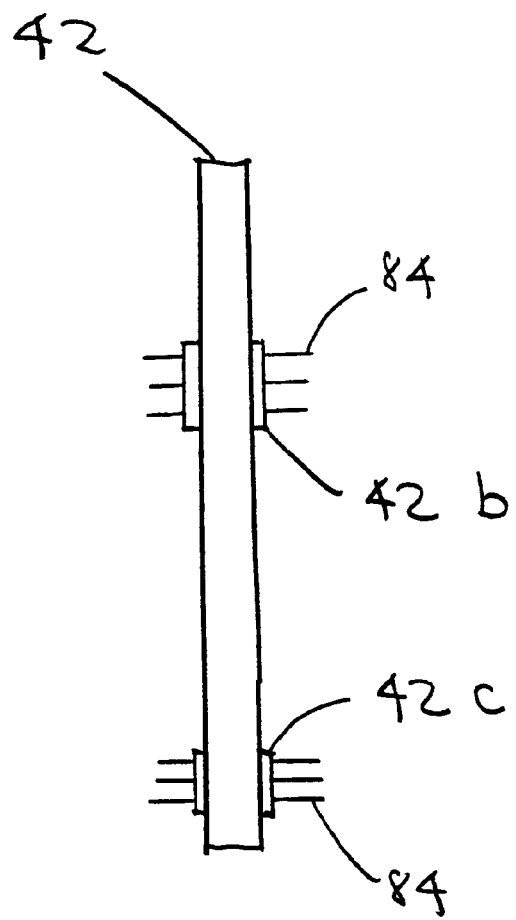
FIG. 7 is a cross sectional view of the midplane taken along lines 7—7 of FIG. 4.
Figure 8:
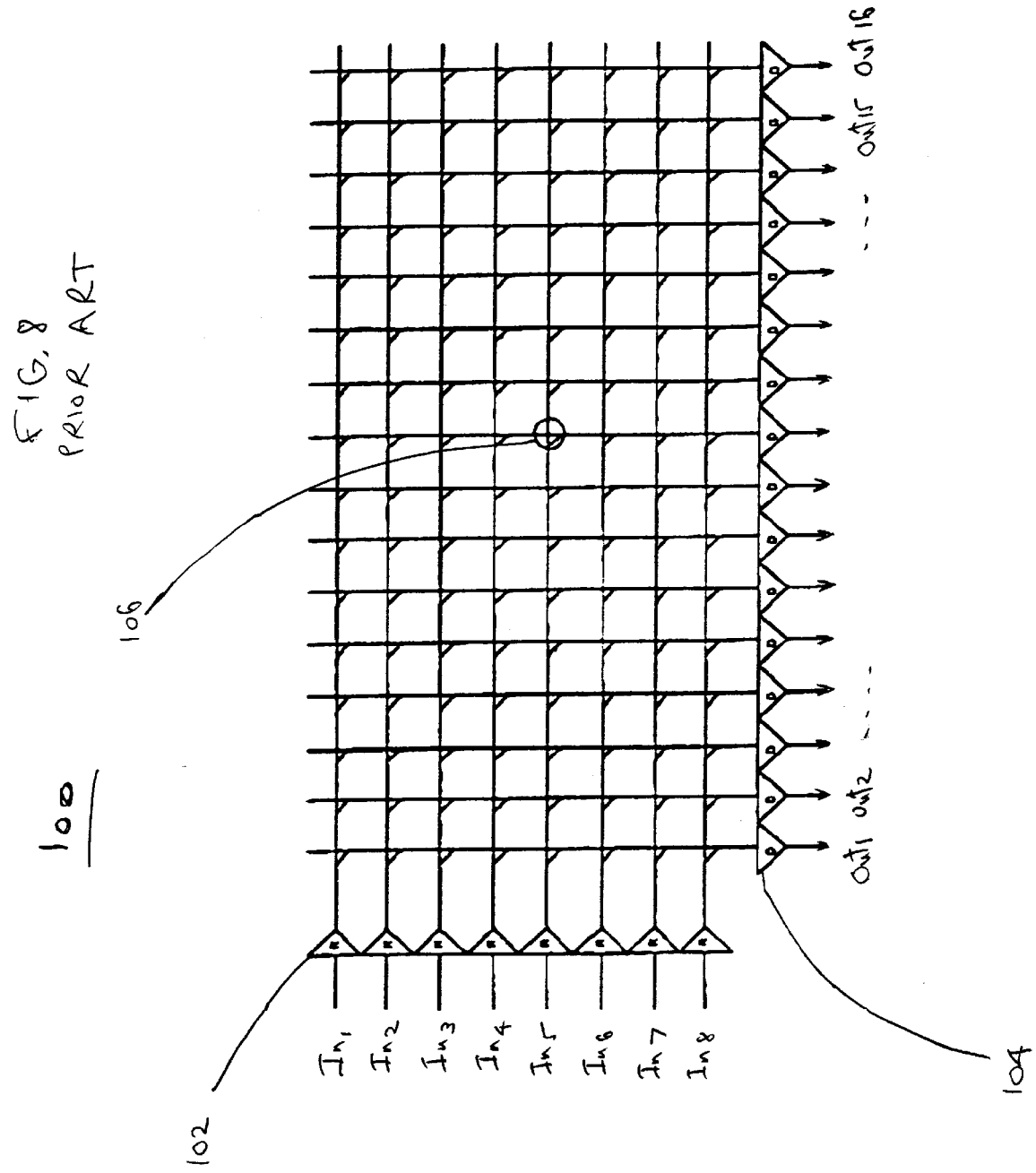
FIG. 8 is an illustration of a conventional 8×16 submatrix switch.

It will be appreciated that female connector block 44a engages male connector block 42a on one side of midplane 42. The other side of connector block 42a which is on the other side of midplane 42 engages another middle matrix module (not shown). In addition, female connector block 46c on middle matrix module 46 engages male connector block 42c on the rear side of midplane 42, while the front side of midplane 42 has male connector block 42c engaging yet another input/output module (not shown). In this manner, all input/output modules are interconnected with all middle matrix modules by way of the pins of midplane 42. Pins 48 may be inserted through midplane 42 and held in fixed position by any conventional method, such as press-fitting. The relationship between pins 48 and midplane 42 is shown in FIG. 7, which is a cross-sectional view taken along lines 7—7 of FIG. 4.

Figure 4:
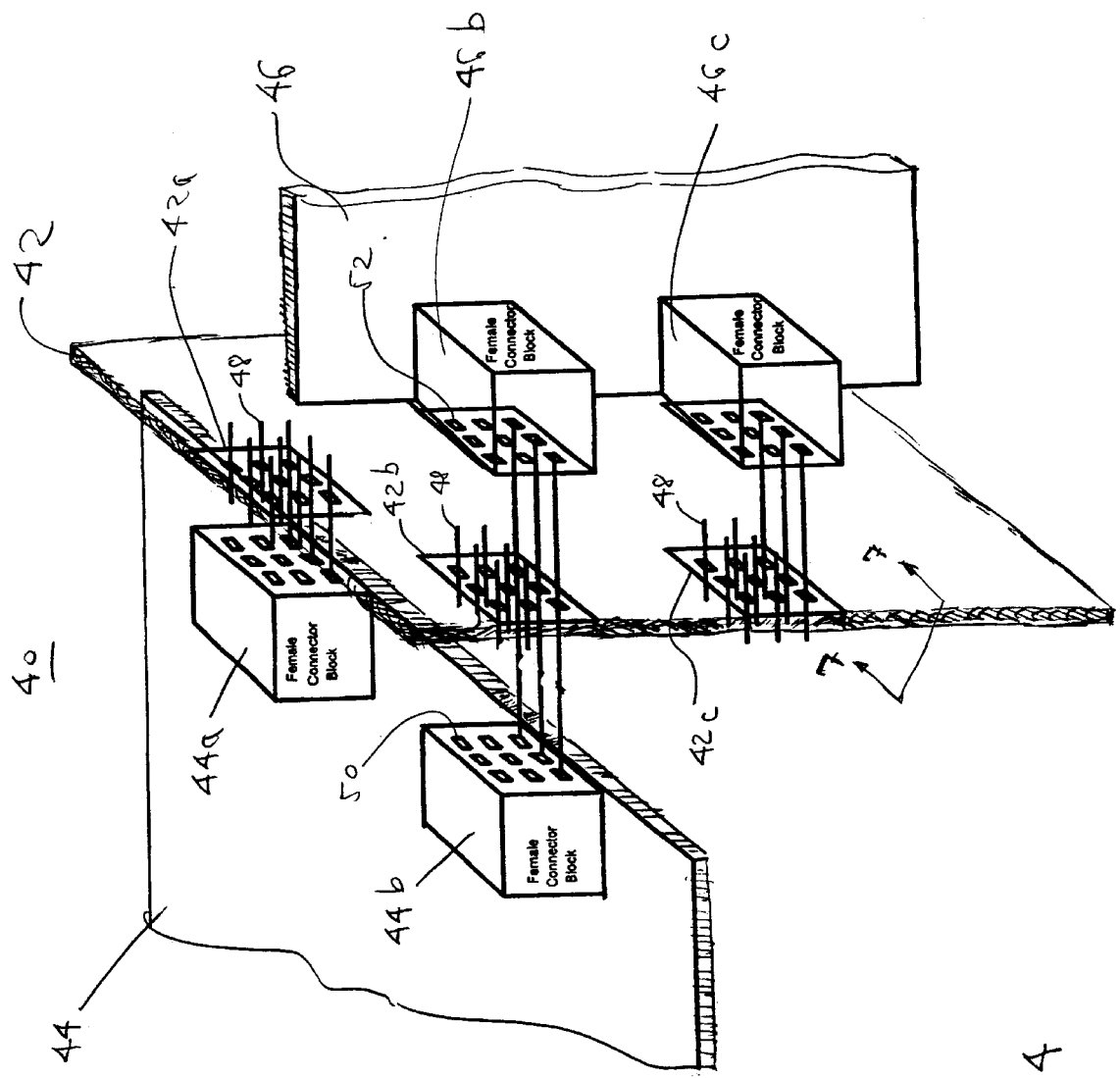
FIG. 4 is an exploded perspective view of a portion of the cross-midplane switch topology of FIG. 3, according to one embodiment of the invention, showing a horizontally oriented module mating with a vertically oriented module by way of a midplane that is oriented orthogonally to the modules.
Figure 5:
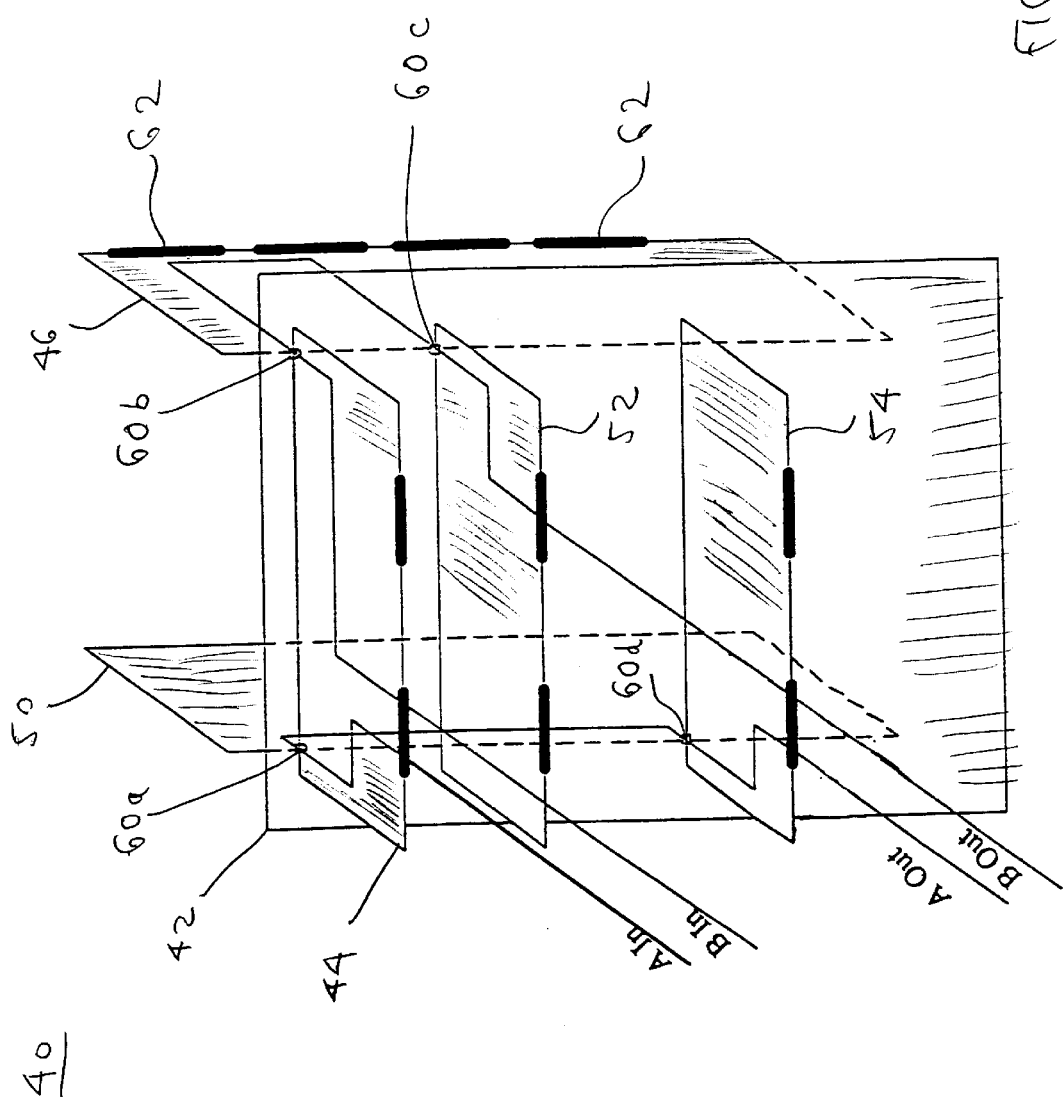
FIG. 5 illustrates paths of signals traversing the cross-midplane switch topology of FIG. 3.

FIG. 5 illustrates signal routing through cross-midplane switch 40. As shown, midplane 42 receives, at the front, horizontally oriented input/output modules 44, 52 and 54 (input/output modules 44, 52 and 54 are also shown in relationship to each other in FIG. 3). Midplane 42 also receives, at the rear, vertically oriented middle matrix modules 46 and 50 (middle matrix modules 46 and 50 are shown in relationship to each other in FIG. 3). Mating connectors are also shown between the modules and the midplane. For explanation purposes, the mating connectors are represented by small circles designated 60a–60d. It will be appreciated that each small circle represents a female connector block on an input/output module, a female connector block on a middle matrix module and a mating male connector on the midplane, the three providing connection for the two modules to each other. For example, circle 60b represents female connector block 44b, female connector block 46b, and male connector 42b with pins 48, as illustrated in FIG. 4.

In operation, signal A (Ain) enters top input/output module 44, traverses the circuitry (not shown) on input/output module 44 and passes through midplane 42, at circle 60a, into middle matrix module 50. Next, signal A traverses the circuitry (not shown) and the leftmost portion of middle matrix module 50 toward lower input/output module 54. Signal A passes through midplane 42, at circle 60d, into lower input/output module 54. Finally, signal A traverses the circuitry (not shown) of lower input/output module 54 and emerges as signal Aout.

Still referring to FIG. 5, signal B (Bin) enters input/output module 44 and exits the module at circle 60b. Next, signal B passes through pins 48 of midplane 42 and enters middle matrix module 46. After traversing middle matrix module 46, signal B passes through midplane 42, at circle 60c, and enters input/output module 52. Finally, signal B exits input/output module 52 as signal Bout.

Having described FIGS. 1–5, it will now be appreciated that the cross-midplane switch topology minimizes backplane wiring complexity and minimizes travel distance of signals. Input receivers and output drivers, along with input and output matrix switch arrays are placed on input/output modules. Rather than single ended drivers and receivers, balanced drivers and receivers may be placed on the input/output modules. These balanced drivers may be mounted horizontally within a chassis having a midplane. On the other side of the midplane, middle matrix modules, having balanced drivers and receivers, may be mounted vertically within the chassis on the midplane. This geometry allows for connections between input, middle, and output matrices to be made directly between input/output and middle matrix modules without fabric signals traversing the backplane. Connections between one chassis and another chassis may be made via cables (not shown) having connectors mating with connectors 62 (FIG. 5) on the outboard edges of middle matrix module 46, for example.

The topology described in FIGS. 3–5 may be referred to as a cross midplane switch or CMX, because the orientation of modules on one side of the midplane is orthogonal to the orientation of modules on another side of the midplane. With this cross-midplane topology, fabric signals traversing the backplane are non-existent, and all controlled impedance signal traces are on the input/output and middle matrix modules. This means that the type of drivers and receivers employed (single-ended or balanced, higher or lower speed) as well as the signal trace impedance may be tailored to each application. Also, modules of different speeds may be mixed, since higher speed modules are always capable of carrying lower speed signals and are interoperable if their interface signaling levels are compatible.

CMX geometry may also permit different speed modules to be integrated. For example, 16 input/output modules and 16 middle matrix modules may occupy a chassis. If all 16 input/output modules are populated with 32 port RS-422 modules, then there should be 16 middle matrix modules capable of switching 10 Mbps signals. If, for example, there are eight OC-3 input/output modules with 6 ports each in a chassis, then there may be three middle matrix modules, each capable of switching 155 Mbps (OC-3) signals. In order to provide a test path, for example, it may be desirable, but not necessary, to provide a forth middle matrix module also capable of operating at 155 Mbps. If the remainder of the chassis having eight OC-3 input/output modules were filled with additional eight RS-422 input/output modules, then a complement of middle matrix modules would be four middle matrix modules capable of operating at 155 Mbps and twelve middle matrix modules capable of operating at 10 Mbps. This arrangement may provide an array that is unconditionally non-blocking (UNB), because a higher speed signal path may always be used to route a lower speed signal, and an RS-422 portion of such an array would thus be UNB. Moreover, an OC-3 portion of such an array may also be UNB, as the routing of lower speed signals through the higher speed middle matrix modules does not interfere with the ability to route high speed signals through the same middle matrix modules.

In general, the topology of a switch having the geometry shown in FIGS. 3–5 may be viewed as having input and output functions on one set of modules (the input/output modules) and switching or processing functions on an orthogonally oriented set of modules (the middle matrix modules). Input/output modules may be connected directly to the middle matrix modules via connectors on the midplane and without fabric signals traversing a backplane. In addition to supporting physical layer switching functions, a switch arranged as shown in FIGS. 3–5 may be used to perform other switching functions, such as, frame relay or ATM. Conversion functions may also be performed, such as protocol conversion, compression or encryption, as well as any combination of these. In addition, connectors may be used on a front edge of the middle matrix modules to facilitate interconnection to other switch chassis, thereby permitting expansion.

It will also be appreciated that it is not necessary that the input/output modules be mounted horizontally and the middle matrix modules be mounted vertically. Their orientation may be reversed. In the preferred embodiment, however, the input/output modules are mounted horizontally and the middle matrix modules are mounted vertically. This orientation is preferred, because the input/output modules are more frequently removed from the chassis. The cables to the input/output modules may be dressed to the left and right sides of the chassis. In this manner, the modules are not cable-bound (i.e. unable to be removed without disconnecting cables not associated with the particular module to be removed). Although the middle matrix modules are mounted vertically and interconnection of multiple chassis is accomplished by cabling them together, these cables are changed less frequently and may be dressed to the top and bottom of the chassis in order to preclude these modules from becoming cable bound.

Figure 6:
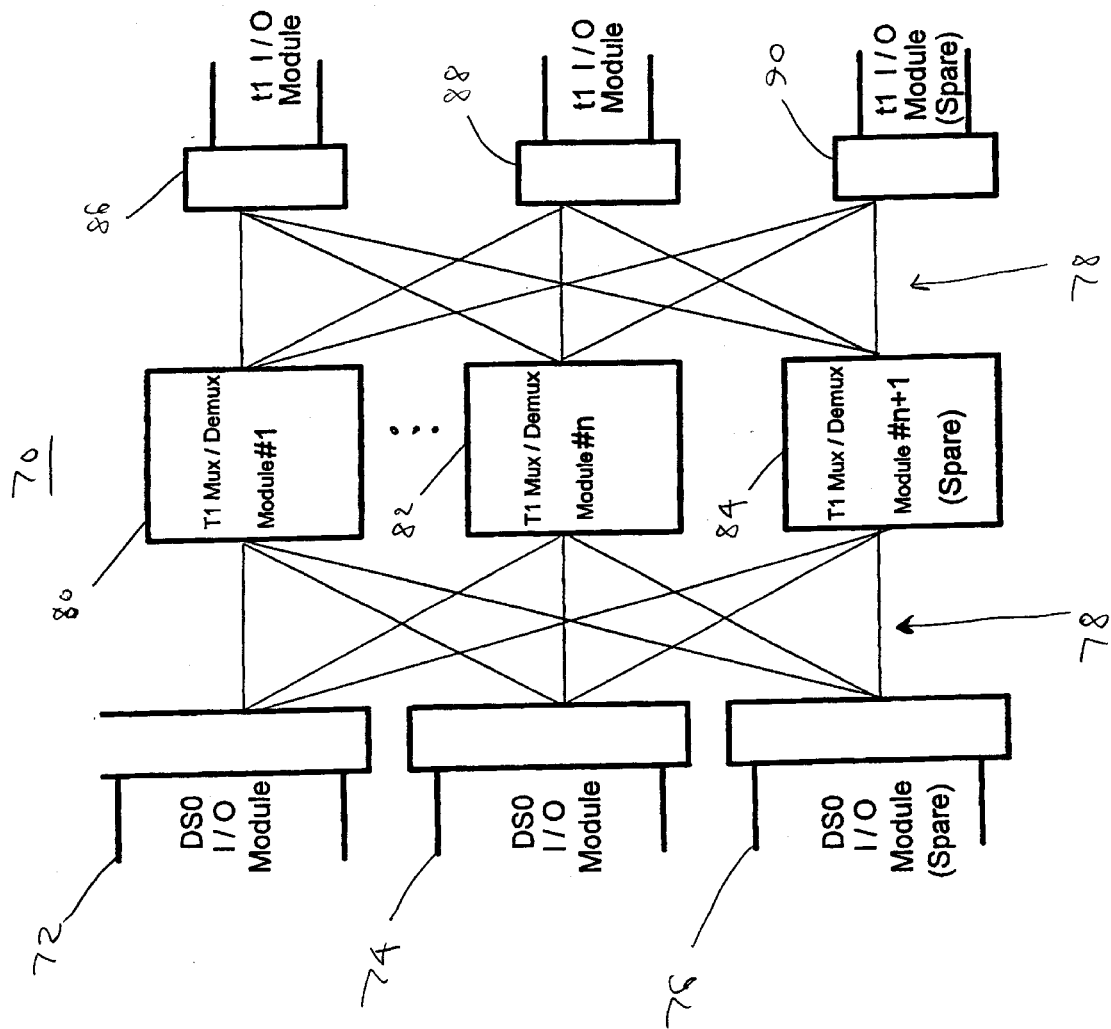
FIG. 6 is a schematic block diagram of a three stage electronic system that may employ the cross-midplane topology of the present invention.

Furthermore, CMX topology may be applied to other electronic systems having input, output and processing functions. In such electronic systems, input and output modules (performing input and output functions) may be connected directly to processing modules (performing processing functions) using a cross-midplane topology. One such embodiment is shown in FIG. 6 and is generally designated as 70. A first stage in electronic system 70 includes a plurality of DSO input/output modules 72, 74 and 76. A second stage in electronic system 70 includes a plurality of T1 multiplexer/demultiplexer modules, numbered 1 through n+1, and designated with numerals 80, 82 and 84. A third stage includes a plurality of t1 input/output modules 86, 88 and 90. The connecting fabric between the first and second stages and the second and third stages is generally designated as 78.

Applying CMX topology to the electronic system shown in FIG. 6, the DSO input/output modules and the t1 input/output modules may be populated on horizontally oriented circuit boards 44, 52 and 54, for example, as shown in FIG. 3. The T1 multiplexer/demultiplexer modules may be populated on the vertically oriented circuit boards 46, 50, etc., as shown in FIG. 3. Midplane 42 includes connecting fabric 78, which in CMX topology are a plurality of pins 48, as shown in FIG. 4.

By providing n+1 modules of T1 multiplexers/demultiplexers, a robust system is created. In the event of a multiplexer module failure, another multiplexer module may be switched into the electronic system between the first stage and third stage. Similarly, if a t1 input/output module fails, another t1 input/output module may be substituted.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A chassis for holding modules comprising:
   a set of first modules oriented horizontally in the chassis,
   a set of second modules oriented vertically in the chassis,
   a midplane oriented orthogonally to the sets of first and second modules, including first and second sides and connector pins extending from the first side through to the second side,
   each of the first modules including a first connector for mating with the connector pins extending from the first side,
   each of the second modules including a second connector for mating with the connector pins extending from the second side, and wherein input and output functions comprising balanced differential drivers and receivers which permit balanced differential signaling are present in one of said first or second modules, and wherein switching functions comprising balanced differential drivers and receivers which permit balanced differential signaling are present in the other of said first or second modules and all controlled impedance signal traces are on said first and second modules.

2. The chassis of claim 1 further including each of the first modules having first and third stages of switching arrays and each of the second modules having a second stage of switching arrays, wherein the first, second and third stages of switching arrays are sequentially connected in series.

3. The chassis of claim 2 wherein a signal is routed from the first stage into the second stage by way of at least one pin of the connector pins on the midplane, and then sequentially routed from the second stage to the third stage by way of at least another pin of the connector pins on the midplane.

4. The chassis of claim 1 wherein the first and second connectors are female connectors for respectively mating with the connector pins extending from the first and second sides of the midplane.

5. The chassis of claim 1 wherein the midplane includes power and ground signals.

6. The chassis of claim 1 wherein the first and second connectors are each located at an end of the first and second modules, respectively, and a third connector is provided at an opposite end of each of the first and second modules for connection to another chassis.

7. An electronic system having three serially connected stages of switching arrays comprising:
   a set of first modules, wherein each of the first modules includes circuitry for first and third stages of the three serially connected stages of switching arrays,
   a set of second modules, wherein each of the second modules includes circuitry for a second stage of the three serially connected stages of switching arrays,
   a midplane having first and second sides, and connector pins extending from the first side through to the second side, and
   ends of the connector pins on the first side engaging the set of first modules and ends of the connector pins on the second side engaging the set of second modules,
   wherein when the ends of the connector pins on the first side engage the set of first modules and the ends of the connector pins on the second side engage the set of second modules, the three stages of switching arrays become serially connected, and
   wherein input and output functions comprising balanced differential drivers and receivers which permit balanced differential signaling are present in one of said first or second modules, and wherein switching functions comprising balanced differential drivers and receivers which permit balanced differential signaling are present in the other of said first or second modules and all controlled impedance signal traces are on said first and second modules.

8. The electronic system of claim 7 wherein the set of first modules are horizontally oriented to each other and the set of second modules are vertically oriented to each other.

9. The electronic system of claim 8 wherein the midplane is orthogonally oriented to the set of first modules and the set of second modules.

10. The electronic system of claim 7 wherein a signal is routed from the first stage into the second stage by way of at least one pin of the connector pins extending through the midplane, and then sequentially routed from the second stage to the third stage by way of at least another pin of the connector pins extending through the midplane.

11. The electronic system of claim 7 wherein each of the first and second modules include at least one female connector for mating with the connector pins extending through the midplane.

12. The electronic system of claim 7 wherein the midplane includes power and ground signals.

13. The electronic system of claim 7 wherein the set of first modules is 16 first modules and the set of second modules is 16 second modules and each of the sets are placed on opposite sides of the midplane.

14. The electronic system of claim 13 wherein both sets and the midplane are placed in one chassis.

15. The electronic system of claim 7 wherein the first module includes a 32×64 input submatrix switching array for the first stage and a 64×32 output submatrix switching array for the third stage, and the second module includes a 128×128 middle submatrix switching array for the second stage.

16. The electronic system of claim 15 wherein the 32×64 input submatrix switching array includes 32 input receivers and 64 single ended output drivers.

17. The electronic system of claim 7 wherein the first module includes a DSO input/output module and a t1 input/output module, and the second module includes a T1 multiplexer/demultiplexer module.

18. A method for connecting circuit boards in a chassis comprising
(a) providing for the chassis a midplane having first and second sides,
(b) inserting pins into the midplane so that one end of each of the pins extends a first distance from the first side of the midplane and the other end of each of the pins extends a second distance from the second side of the midplane,
(c) providing a set of first circuit boards and a set of second circuit boards for the chassis,
(d) attaching first and second female connectors to each of the first and second circuit boards, respectively,
(e) engaging the first female connector to a set of the one ends of pins extending from the first side of the midplane, and
(f) engaging the second female connector to a further set of the other ends of pins extending from the second side of the midplane, and wherein input and output functions comprising balanced differential drivers and receivers which permit balanced differential signaling are present in one of said first or second set of circuit boards, and wherein switching functions comprising balanced differential drivers and receivers which permit balanced differential signaling are present in the other of said first or second set of circuit boards and all controlled impedance signal traces are on said first and second sets of circuit boards.

19. The method of claim 18 wherein (c) includes horizontally orienting the set of first circuit boards in the chassis and vertically orienting the set of second circuit boards in the chassis.

20. The method of claim 19 wherein the midplane is oriented orthogonally to the sets of first and second circuit boards.

21. A chassis of claim 1, wherein said input and output functions are mounted in said first modules which are oriented horizontally in said chassis and said switching functions are mounted in said second modules which are oriented vertically in said chassis.

22. A chassis of claim 1, wherein said chassis provides an array that is unconditionally non-blocking.

* * * * *